United States Patent [19]

Werrbach

[11] Patent Number: 5,424,488
[45] Date of Patent: Jun. 13, 1995

[54] TRANSIENT DISCRIMINATE HARMONICS GENERATOR

[75] Inventor: Donn Werrbach, Burbank, Calif.

[73] Assignee: Aphex Systems, Ltd., Sun Valley, Calif.

[21] Appl. No.: 72,995

[22] Filed: Jun. 7, 1993

[51] Int. Cl.⁶ .............................................. G10H 1/06
[52] U.S. Cl. ........................................ 84/698; 84/699
[58] Field of Search ............... 84/671, 692, 693, 698, 84/699, 702, 703, 718

[56] References Cited

U.S. PATENT DOCUMENTS

| | | | |
|---|---|---|---|
| 3,495,021 | 2/1970 | Cunningham | 84/698 |
| 3,636,801 | 1/1972 | Ichikana | 84/693 |
| 3,739,071 | 6/1973 | Niinomi | 84/1.19 |
| 3,746,775 | 7/1973 | Uchiyama | 84/1.26 |
| 3,937,115 | 2/1976 | Stacey | 84/1.23 |
| 4,150,253 | 4/1979 | Knoppel | 179/1 R |
| 4,175,465 | 11/1979 | Schmoll, III | 84/1.26 |
| 4,198,891 | 4/1980 | Weber | 84/1.03 |
| 4,442,745 | 4/1984 | Gross et al. | 84/1.01 |

Primary Examiner—Vit W. Miska
Attorney, Agent, or Firm—Thomas I. Rozsa; Tony D. Chen

[57] ABSTRACT

A transient discriminate harmonics generator which receives an audio input signal and produces an output signal containing harmonics of the input signal. The output signal is amplitude shaped as a function of the input signal's time and amplitude envelope. The present invention transient discriminate harmonics generator generally comprises a control circuit for determining a control parameter, and a harmonics generating circuit regulated by the control circuit for producing an output signal containing harmonics of an input signal, where the transient discriminate harmonics generator first generates a relatively high level of harmonics at an initial occurrence of the input signal, then incrementally reduces the level of harmonics generated during a time period determined by the control parameter following the initial occurrence of the input signal, and finally produces a relatively low level of harmonics after the end of the time period.

40 Claims, 2 Drawing Sheets

Harmonics output at point 50 of figure 1

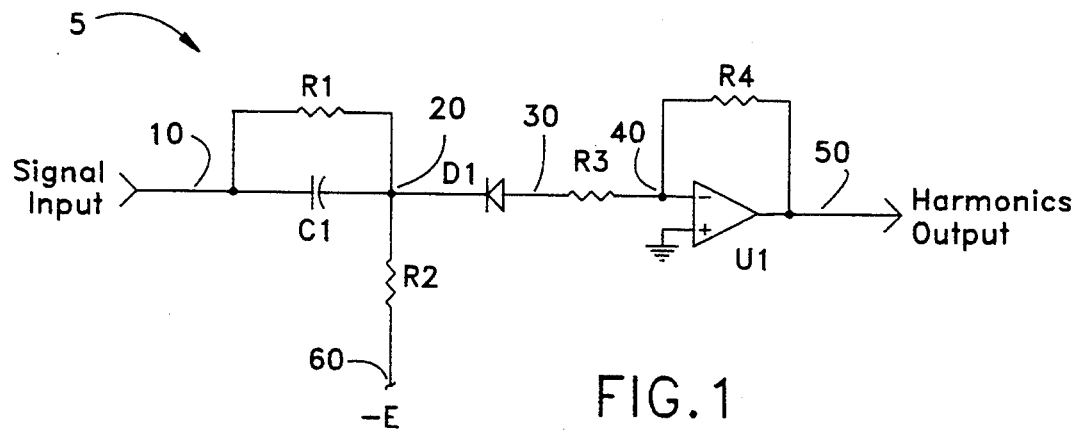
FIG.1
Input tone at point 10 of figure 1
Harmonics output at point 50 of figure 1
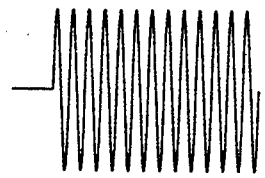 
FIG.2(a)    FIG.2(b)
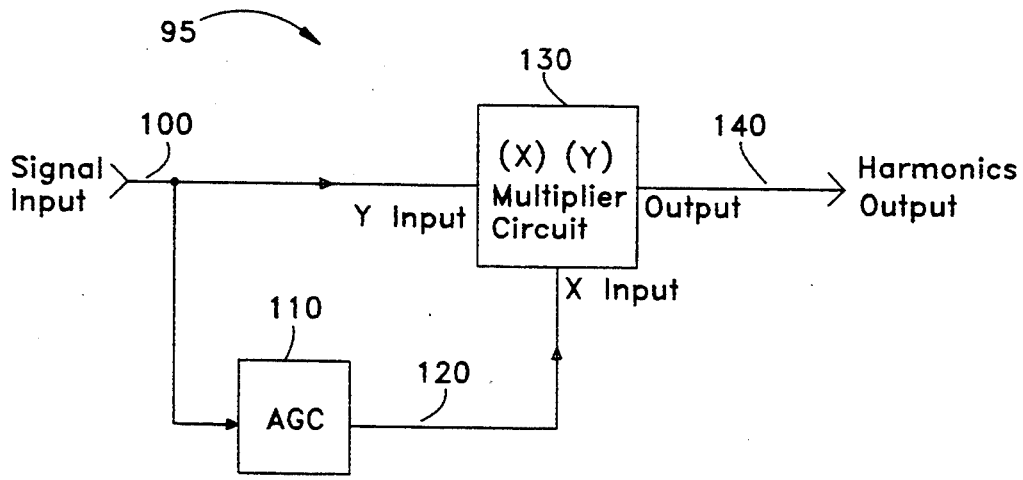
FIG.3

Input tone at point 100 of figure 3

AGC output signal at point 120 of figure 3

Harmonics output signal at point 140 of figure 3

TRANSIENT DISCRIMINATE HARMONICS GENERATOR

BACKGROUND OF THE INVENTION

1. Field of The Invention

The present invention generally relates to the field of electronic audio equipment. More particularly, the present invention relates to the field of harmonics generators.

2. Description of The Prior Art

Harmonics generators are widely used in various applications of audio signal processing utilized for creating musical sound effects and enhancing sound quality. For example, a product made by Aphex Systems Ltd. called an "Aural Exciter" under U.S. Pat. No. 4,150,253 is based partly upon the use of a harmonics generator. Generally, a harmonics generator can be defined as a device which is used intentionally to produce harmonics of an input signal. Such a device may also produce spurious frequencies, for example beat frequencies, without violating the definition of a harmonics generator. A simple harmonics generator can be comprised of a full-wave rectifier circuit. The output signal from a full wave rectifier contains not only harmonics of the input signal, but also beat frequencies if the input signal is composed of typical audio waveforms which are composed of many frequency components.

In the prior art, non-linear circuits such as log amplifiers, rectifiers and multipliers are used as harmonics generators. These circuits all follow different harmonics generation laws depending on their input-output transfer functions. However, it can be generalized that the amplitude of the harmonics in the output signal is mainly a function of the input signal amplitude without regard to time. As a result, the harmonics which are developed resemble merely distortion products of the input signal. The usability of prior art harmonics generators for sound enhancement and music is therefore limited because the harmonics produced do not generally resemble harmonics of natural sounds and thus, are not pleasing to the human ear.

It is desirable to provide a harmonics generator that can generate harmonics which is not only a function of the amplitude of the input signal, but also a function of the time, to thereby better resemble the harmonics of natural sounds for sound enhancement and music.

SUMMARY OF THE INVENTION

The present invention is a transient discriminate harmonics generator. The present invention generates harmonics with a time and amplitude relationship that more closely resembles the harmonics of natural sounds.

The present invention can be better understood by modeling a natural event as follows. Suppose natural harmonics are created by striking a brass gong with a steel hammer. At the first instant, the sound of the gong is extremely rich in harmonic content. As the sound decays, the relative level of the harmonics decays at a higher rate than the level of basic note frequency, i.e., the fundamental frequency. Eventually, the sound decays to a pure tone devoid of harmonics. The steel hammer strike represents a transient excitation force having a steeply rising wavefront. If the gong is later struck by the same hammer wrapped in foam rubber, which represents a transient excitation force with a slower wavefront, then the relative amount of harmonics in the sound will be much less, and the tone of the gong will be closer to a pure note. There are two points which can be observed from this model. First, the amount of harmonics in the sound depends on how sharply the gong is struck. Second, the harmonics decays out sooner than the fundamental tone.

In the present invention, a novel and unique harmonics generator is provided, which produces a higher level of harmonics at the beginning of a transient event of the input signal, and a lower level of harmonics following the transient event. In addition, the present invention harmonics generator produces relatively low level harmonics in the output signal upon steady, non transient input signals. This produces a harmonics effect more pleasing to the car and therefore is more usable in music and sound enhancement than the harmonics generated by prior art harmonics generators.

In one preferred embodiment of the present invention, the present invention transient discriminate harmonics generator for generating harmonics of an input signal comprises (a) a resistor-capacitor circuit for setting a time constant having a first end for receiving the input signal and a second end, the resistor-capacitor circuit including a capacitor and a first resistor connected in parallel between the first and second ends;

(b) a diode having an anode and a cathode connected to the second end of the resistor-capacitor circuit for rectifying the input signal;

(c) a negative power source for supplying a negative voltage to the cathode of the diode through a resistor circuit which includes a second resistor connected between the negative power source and the cathode of the diode;

(d) a current-voltage converter connected to the anode of the diode for producing an output signal containing harmonics of the input signal, the current-voltage convertor including an operational amplifier having a positive input pin, a negative input pin and an output pin, a third resistor connected between the anode of the diode and the negative input pin of the operational amplifier, and a fourth resistor connected between the negative input pin and the output pin of the operational amplifier; and (e) the harmonics generator being capable of producing a relatively high level of harmonics at an initial occurrence of the input signal, and incrementally reducing the level of harmonics generated during a time period determined by the time constant following the initial occurrence of the input signal, and producing a relatively low level of harmonics after the time period.

In an alternative embodiment of the present invention, the present invention transient discriminate harmonics generator for generating harmonics of an input signal comprises:

(a) a multiplier circuit for producing an output signal, the multiplier circuit having an X-channel and a Y-channel, and the output signal being proportional to a product of an X-channel input signal and a Y-channel input signal;

(b) an automatic gain control circuit for producing a control signal to modulate the multiplier circuit, the automatic gain control circuit having an input end and an output end and a variable resister circuit for adjusting the control signal;

(c) the multiplier circuit and the automatic gain control circuit utilizing a dual operational transconductance amplifier chip, where the automatic gain control circuit uses one functional half of the dual operational transconductance amplifier chip, and the multiplier circuit uses another functional half of the dual operational transconductance amplifier chip;

(d) the Y-channel of the multiplier circuit and the input end of the automatic gain control circuit being connected together to receive the input signal;

(e) the input end of the automatic gain control circuit further including a resistor-capacitor circuit for setting a time constant;

(f) the output end of the automatic gain control circuit utilizing a Darlinton part of the dual operational transconductance amplifier chip and connected to the X-channel of the multiplier circuit, such that the output signal of the multiplier circuit contains harmonics which are proportional to the product of the input signal and the control signal from the automatic gain control circuit;

(g) a power source for energizing the automatic gain control circuit and the multiplier circuit; and (h) the harmonics generator being capable of producing a relatively high level of harmonics at an initial occurrence of the input signal, and incrementally reducing the level of harmonics generated during a time period determined by the time constant following the initial occurrence of the input signal, and producing a relatively low level of harmonics after the time period.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated:

FIG. 1 is a schematic diagram of one of the preferred embodiments of the present invention showing a transient discriminate harmonics generator utilizing a diode rectifier.

FIG. 2(a) is an illustrative diagram showing the waveshape of the signal input at point 10 of FIG. 1.

FIG. 2(b) is an illustrative diagram showing the waveshape of the harmonics output at point 50 of FIG. 1.

FIG. 3 is a block diagram of another one of the preferred embodiments of the present invention showing a transient discriminate harmonics generator which utilizes an automatic gain control (AGC) circuit in addition to a multiplier circuit.

DESCRIPTION OF THE PREFERRED EMBODIMENT

Figure 4A:
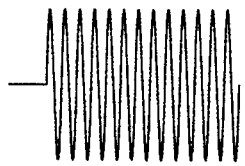
FIG. 4(a) is an illustrative diagram showing the waveshape of the signal input at point 100 of FIG. 3.

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

Referring to FIG. 1, there is shown at 5 a schematic diagram of one of the preferred embodiments of the present invention showing a transient discriminate harmonics generator utilizing a diode rectifier. An input signal is supplied at point 10. The input signal at point 10 may be sourced from a low impedance such as an operational amplifier output, and the input signal may represent an AC audio waveform resting on zero volts DC. Resistor R1 and capacitor C1 serve as a time constant circuit as will be described. By way of example only, resistor R1 may be 270 k$\Omega$, and capacitor C1 may be 0.1 $\mu$F. A negative voltage $-E$ is provided at point 60, where a resistor R2 is used to conduct a small negative current into diode D1 from the negative voltage $-E$. This small current is sufficient to offset the forward voltage drop of diode D1 and bring diode D1 to the verge of forward conduction. By way of example only, the negative voltage $-E$ may be $-15$ V, and resistor R2 may be 2.2 M$\Omega$. Operational amplifier U1 is configured with resistors R3 and R4 as a current-voltage converter. By way of example only, resistor R3 may be 4.7 K$\Omega$, and resistor R4 may be 10 K$\Omega$. When the negative current is applied to point 30, a positive voltage will appear at point 50. As can be seen, any current supplied to resistor R3 must pass through diode D1. Since diode D1 is oriented to pass only a negative current to resistor R3, an output at point 50 will only be present when a negative current flows, i.e., there will never be a positive current into resistor R3. This produces a rectification effect for AC voltage appearing at point 20 of the circuit. The rectification effect produces a positive polarity half-wave output signal at point 50 representing the negative polarity half waves of the AC signal of point 20. This output signal contains harmonics of the input signal.

When an input tone is suddenly supplied as the input signal to point 10, during the first few cycles of the tone, diode D1 conducts current from the negative half cycles and produces a positive polarity output at point 50. Each half cycle of conduction through diode D1 into resistor R3 charges up capacitor C1 a little further. The charging time of capacitor C1 is a function of the resistor-capacitor (R3-C1) time constant. As capacitor C1 begins to charge, a positive DC voltage begins to develop at point 20 relative to point 10. Since point 10 is held near DC ground potential by the signal source, the DC charge appears as a positive bias to the cathode of diode D1 reversing the forward bias supplied by resistor R2, and taking diode D1 towards the reverse biased condition. Each subsequent audio cycle appearing at point 20 moves further out of conduction of diode D1 by the developing DC bias voltage of capacitor C1. Eventually, the DC bias of capacitor C1 approaches the peak level of the input tone burst, and only a small part of the half-cycle peak tips can produce a current into diode D1. The result of this action is that the tone burst produces an output signal at 50 which begins at a large amplitude and continuously drops in amplitude with each successive half cycle until a relatively small amplitude is produced and sustained. This is depicted in FIGS. 2(a) and 2(b), where the input tone is shown in FIG. 2(a), with the resultant output signal shown in FIG. 2(b).

The amplitude of the harmonic output signal shown in FIG. 2(b) is greater at the first instance of applying the input signal, and diminishes or "ramps down" to a smaller level. This may be called the "attack" parameter of the harmonics generator 5. The attack time constant should be chosen for optimal sonic benefits in a particular application. For the circuit shown in FIG. 1, the time constant of resistor R3 and capacitor C1 determine the slope of the attack parameter. Resistor R1 serves the purpose mainly of providing a suitable discharge path for C1 after the input signal is removed.

The present invention illustrated in FIG. 1 utilizes a diode rectifier in the harmonics generator circuit. However, the present invention is not limited to any specific means of creating harmonics, as long as the shaping of the output harmonics is enforced. For example, the present invention may also utilize a multiplier in its circuit.

Referring to FIG. 3, there is shown at 95 a block diagram of another one of the preferred embodiments of the present invention showing a transient discriminate harmonics generator which utilizes an automatic gain control (AGC) circuit in addition to a multiplier circuit. The multiplier 130 used in the present invention harmonics generator circuit 95 may be a linear multiplier having a transfer function of (XY)/K. It could also be any variety of voltage control amplifiers (VCAs) with a signal input, signal output and gain control input. If a VCA is utilized, it can be defined as an XY multiplier if we call the signal input the "Y" channel input and the gain control input the "X" channel input. The only difference between a linear multiplier and a VCA used as a multiplier is that the transfer function of a VCA "X" input is usually exponential, so that the output transfer function would be generally (Y)(exp X)/K. Nevertheless, the output of the linear multiplier or the VCA used as a multiplier will contain harmonics of the input signal, and the circuit shown in FIG. 3 remains valid.

When multiplier 130 is a linear multiplier, its output function is (XY)/K, when X is the signal at X input, and Y is the signal at Y input, and K is a constant. If the X and Y inputs are fed an equal signal, i.e., the automatic gain control (AGC) circuit 110 is removed, then the multiplier output at point 150 would be $y^2/K$ and would represent a typical circuit of prior art harmonics generators. If the input signal is sinusoidal, this translates to $\sin^2/K$ which contains a frequency which is the second harmonic of the input signal. As discussed before, the harmonics output resembles merely the distortion products of the input signal, and the usability of such prior art harmonics generator for sound enhancement and music is limited because the harmonics produced do not generally resemble harmonics of natural sounds.

In the present invention, the addition of the AGC circuit 110 greatly changes the character of the multiplier harmonics generator. The parameters of the AGC circuit 110, such as specific compression ratio, attack and release times of the AGC, are to be determined for best effect in a particular application. Nonetheless, the attack time is required to be of a finite value. For example, the AGC circuit 110 may have an infinite compression ratio, an attack time of about 20 ms, and a threshold 10 dB below the input signal level.

Figure 4B:
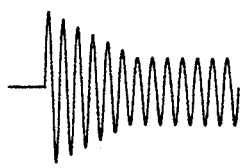
FIG. 4(b) is an illustrative diagram showing the waveshape of the output signal of the automatic gain control circuit at point 120 of FIG. 3.
Figure 4C:
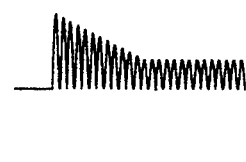
FIG. 4(c) is an illustrative diagram showing the waveshape of the harmonic output at point 140 of FIG. 3.

Referring to FIGS. 4(a), 4(b) and 4(c), there are shown respectively the waveform of the input signal at point 100 which is also the Y input of the multiplier 130, the waveform expected at the AGC output point 120 which is also the X input of the multiplier 130, and the waveform of the multiplier harmonics output at point 140. It can be seen that the AGC circuit 110 produces an initial output overshoot during the AGC attack time. This AGC overshoot results in a shaped harmonics output from the multiplier 130 by producing a greater XY product during the overshoot period and a lesser XY product after the AGC output level is stable.

Figure 5:
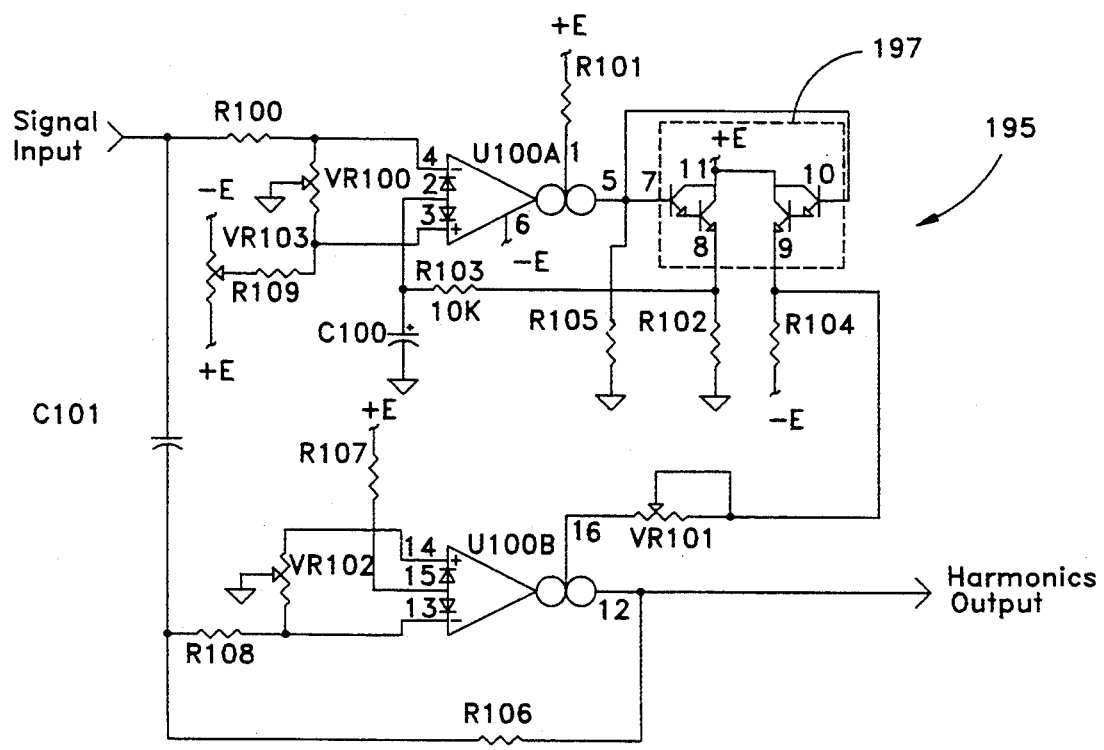
FIG. 5 is a detailed circuitry diagram of the preferred embodiment of the present invention shown in the block diagram FIG. 3.

Referring to FIG. 5, there is shown at 195 a functional circuit based on the block diagram of FIG. 3. It is understood that the harmonics generator circuit 195 is merely an illustrative and sample circuit of many possible implementation of the block diagram shown in FIG. 3. The harmonics generator circuit 195 includes two functional circuits: a multiplier circuit and an AGC circuit. The two circuits are based on an LM13700 dual operational transconductance amplifier (OTA) chip, which is used as a multiplier with one half U100B, and an AGC amplifier with the other half U100A. The pin numbers shown thereon (1 through 16) are the pin numbers of the LM13700 dual OTA chip. The multiplier circuit also includes capacitor C101, resistors R106, R107 and R108, and variable resistors VR101 and VR102. By way of example only, capacitor C101 may be 22F, resistors R106 and 107 may be 10 KΩ, resistor R108 may be 5 kΩ, variable resistor VR101 may be 50 KΩ, and variable resistor VR102 may be 1 KΩ. The AGC circuit also includes capacitor C100, resistors R100, R101, R102, R103, R104, R105 and R109, and variable resistors VR100 and VR103. The dotted block 197 is the Darlingtons part of the LM13700 dual OTA chip, which is used not to buffer the output of the multiplier, but rather to buffer the output of the AGC amplifier. By way of example only, capacitor C100 may be 4.7 μF, resistor R100 may be 250 KΩ, resistor R101 may be 30 KΩ, resistors R102, R103 and R104 may be 10 KΩ, resistor R105 may be 100 KΩ, resistor R109 may be 10 MΩ, variable resistor VR100 may be 25 kΩ, and variable resistor VR103 may be 50 KΩ. The improvement in the circuitry element utilizing the LM13700 dual OTA chip involves the following circuit components. Variable resistors VR103 and R109 have been added to allow better nulling of the control feedthrough of the AGC amplifier. Capacitor C101 has been added to isolate the DC input offset voltage of the multiplier circuit. In addition, positive voltage +E and negative voltage −E are provided to the circuit. By way of example only, the positive voltage +E may be 15 V and the negative voltage −E may be −15 V.

Referring to both FIGS. 3 and 5, the harmonics generator circuit 195 operates as follows. The AGC circuit 110 shown in FIG. 3 is provided by the circuit of U100A. The AGC output at point 120 of FIG. 3 is equivalent to the output at pin 9 of the LM13700 second Darlingtons transistor. The multiplier 130 shown in FIG. 3 is provided by the circuit of U100B. The X input of FIG. 3 is translated as a current input at pin 16 of U100B by the input resistance of variable resistor VR101. The Y input of FIG. 3 is represented as the signal input to resistor R100. The AGC input of FIG. 3 is represented as the signal input to capacitor C101. The harmonics output at point 140 of FIG. 3 is equivalent to the U100B pin 12 output. It is noted that this is a high impedance output and must not be significantly loaded by any external impedances for correct operation.

It is emphasized that the circuit shown in FIG. 5 is not intended as a limitation to the embodiment of the present invention transient discriminate harmonics generator. It has been shown how the present invention can be implemented in numerous ways. There are undoubtedly many more circuits including various means of generating harmonics which can be adapted to follow the teachings of the present invention. Therefore, the present invention is not limited to the examples which were shown here. In addition, the teachings of the present invention can be implemented in digital signal processing with equal validity.

Defined in detail, the present invention is a transient discriminate harmonics generator for generating harmonics of an input signal, comprising:
(a) a resistor-capacitor circuit for setting a time constant having a first end for receiving said input signal and a second end, the resistor-capacitor circuit including a capacitor and a first resistor connected in parallel between the first and second ends;
(b) a diode having an anode and a cathode connected to said second end of said resistor-capacitor circuit for rectifying said input signal;
(c) a negative power source for supplying a negative voltage to said cathode of said diode through a resistor circuit which includes a second resistor connected between the negative power source and said cathode of said diode;
(d) a current-voltage converter connected to said anode of said diode for producing an output signal containing harmonics of said input signal, the current-voltage convertor including an operational amplifier having a positive input pin, a negative input pin and an output pin, a third resistor connected between said anode of said diode and the negative input pin of the operational amplifier, and a fourth resistor connected between the negative input pin and the output pin of the operational amplifier; and
(e) said harmonics generator being capable of producing a relatively high level of harmonics at an initial occurrence of said input signal, and incrementally reducing the level of harmonics generated during a time period determined by said time constant following the initial occurrence of said input signal, and producing a relatively low level of harmonics after said time period.

Defined broadly, the present invention is a transient discriminate harmonics generator for generating harmonics of an input signal, comprising:
(a) a resistor-capacitor circuit for setting a time constant having a first end for receiving said input signal and a second end;
(b) a diode having an anode and a cathode connected to said second end of said resistor-capacitor circuit for rectifying said input signal;
(c) a negative power source for supplying a negative voltage to said cathode of said diode through a resistor circuit;
(d) a current-voltage converter connected to said anode of said diode for producing an output signal containing harmonics of said input signal; and
(e) said harmonics generator being capable of producing a relatively high level of harmonics at an initial occurrence of said input signal, and incrementally reducing the level of harmonics generated during a time period determined by said time constant following the initial occurrence of said input signal, and producing a relatively low level of harmonics after said time period.

Defined more broadly, the present invention is a transient discriminate harmonics generator comprising a resistor-capacitor circuit for setting a time constant and a diode rectifying circuit for producing an output signal containing harmonics of an input signal, the harmonics generator being capable of producing a relatively high level of harmonics at an initial occurrence of the input signal, and incrementally reducing the level of harmonics generated during a time period determined by the time constant following the initial occurrence of the input signal, and producing a relatively low level of harmonics after said time period.

Defined alternatively in detail, the present invention is a transient discriminate harmonics generator for generating harmonics of an input signal, comprising:
(a) a multiplier circuit for producing an output signal, the multiplier circuit having an X-channel and a Y-channel, and the output signal being proportional to a product of an X-channel input signal and a Y-channel input signal;
(b) an automatic gain control circuit for producing a control signal to modulate said multiplier circuit, the automatic gain control circuit having an input end and an output end and a variable resister circuit for adjusting the control signal;
(c) said multiplier circuit and said automatic gain control circuit utilizing a dual operational transconductance amplifier chip, where said automatic gain control circuit uses one functional half of the dual operational transconductance amplifier chip, and said multiplier circuit uses another functional half of the dual operational transconductance amplifier chip;
(d) said Y-channel of said multiplier circuit and said input end of said automatic gain control circuit being connected together to receive said input signal;
(e) said input end of said automatic gain control circuit further including a resistor-capacitor circuit for setting a time constant;
(f) said output end of said automatic gain control circuit utilizing a Darlinton part of said dual operational transconductance amplifier chip and connected to said X-channel of said multiplier circuit, such that said output signal of said multiplier circuit contains harmonics which are proportional to the product of said input signal and said control signal from said automatic gain control circuit;
(g) a power source for energizing said automatic gain control circuit and said multiplier circuit; and
(h) said harmonics generator being capable of producing a relatively high level of harmonics at an initial occurrence of said input signal, and incrementally reducing the level of harmonics generated during a time period determined by said time constant following the initial occurrence of said input signal, and producing a relatively low level of harmonics after said time period.

Defined alternatively and broadly, the present invention is a transient discriminate harmonics generator for generating harmonics of an input signal, comprising:
(a) a multiplier circuit for producing an output signal, the multiplier circuit having an X-channel and a Y-channel, and the output signal being proportional to a product of an X-channel input signal and a Y-channel input signal;
(b) an automatic gain control circuit for producing a control signal to modulate said multiplier circuit, the automatic gain control circuit having an input end and an output end;
(c) said Y-channel of said multiplier circuit and said input end of said automatic gain control circuit being connected together to receive said input signal;
(d) said output end of said automatic gain control circuit being connected to said X-channel of said multiplier circuit, such that said output signal of said multiplier circuit contains harmonics which are proportional to the product of said input signal and said control signal from said automatic gain control circuit; and
(e) said harmonics generator being capable of producing a relatively high level of harmonics at an initial occurrence of said input signal, and incrementally reducing the level of harmonics generated during a time period determined by said control signal following the initial occurrence of said input signal, and producing a relatively low level of harmonics after said time period.

Defined alternatively and more broadly, the present invention is a transient discriminate harmonics generator comprising a harmonics generating circuit for producing an output signal containing harmonics of an input signal, and an automatic gain control circuit connected to a gain control input of the harmonics generating circuit and producing a control signal to modulate said harmonics generating circuit, the harmonics generator being capable of producing a relatively high level of harmonics at an initial occurrence of the input signal, and incrementally reducing the level of harmonics generated during a time period determined by the control signal following the initial occurrence of the input signal, and producing a relatively low level of harmonics after said time period.

Defined even more broadly, the present invention is a transient discriminate harmonics generator comprising:
(a) means for receiving an input signal coupled to a harmonics generating circuit;
(b) said harmonics generating circuit being capable of producing an output signal containing harmonics of said input signal;
(c) said harmonics generator generating a relatively high level of harmonics at an initial occurrence of said input signal;
(d) said harmonics generator incrementally reducing the level of harmonics generated during a time period following the initial occurrence of said input signal; and
(e) said harmonics generator producing a relatively low level of harmonics after the end of said time period.

Defined furthermore broadly, the present invention is a transient discriminate harmonics generator comprising a control circuit for determining a control parameter, and a harmonics generating circuit regulated by the control circuit for producing an output signal containing harmonics of an input signal, where the transient discriminate harmonics generator first generates a relatively high level of harmonics at an initial occurrence of the input signal, then incrementally reduces the level of harmonics generated during a time period determined by the control parameter following the initial occurrence of the input signal, and finally produces a relatively low level of harmonics after the end of the time period.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus shown is intended only for illustration and for disclosure of an operative embodiment and not to show all of the various forms or modification in which the present invention might be embodied or operated.

The present invention has been described in considerable detail in order to comply with the patent laws by providing full public disclosure of at least one of its forms. However, such detailed description is not intended in any way to limit the broad features or principles of the present invention, or the scope of patent monopoly to be granted.

What is claimed is:
1. A transient discriminate harmonics generator for generating harmonics of an input signal, comprising:
   a. a resistor-capacitor circuit for setting a time constant having a first end for receiving said input signal and a second end;
   b. a diode having an anode and a cathode connected to said second end of said resistor-capacitor circuit for rectifying said input signal;
   c. a negative power source for supplying a negative voltage to said cathode of said diode through a resistor circuit;
   d. a current-voltage converter connected to said anode of said diode for producing an output signal containing harmonics of said input signal; and
   e. said harmonics generator being capable of producing a relatively high level of harmonics at an initial occurrence of said input signal, and incrementally reducing the level of harmonics generated during a time period determined by said time constant following the initial occurrence of said input signal, and producing a relatively low level of harmonics after said time period.

2. The invention as defined in claim 1 wherein said resistor-capacitor circuit includes a capacitor and a first resistor connected in parallel between said first and second ends of said resistor-capacitor circuit.

3. The invention as defined in claim 1 wherein said resistor circuit includes a second resistor connected between said negative power source and said cathode of said diode.

4. The invention as defined in claim 1 wherein said current-voltage convertor includes an operational amplifier having a positive input pin, a negative input pin and an output pin, a third resistor connected between said anode of said diode and the negative input pin of the operational amplifier, and a fourth resistor connected between the negative input pin and the output pin of the operational amplifier.

5. A transient discriminate harmonics generator for generating harmonics of an input signal, comprising:
   a. a resistor-capacitor circuit for setting a time constant having a first end for receiving said input signal and a second end, the resistor capacitor circuit including a capacitor and a first resistor connected in parallel between the first and second ends;
   b. a diode having an anode and a cathode connected to said second end of said resistor-capacitor circuit for rectifying said input signal;
   c. a negative power source for supplying a negative voltage to said cathode of said diode through a resistor circuit which includes a second resistor connected between the negative power source and said cathode of said diode;
   d. a current-voltage converter connected to said anode of said diode for producing an output signal containing harmonics of said input signal, the current-voltage convertor including an operational amplifier having a positive input pin, a negative input pin and an output pin, a third resistor connected between said anode of said diode and the negative input pin of the operational amplifier, and a fourth resistor connected between the negative input pin and the output pin of the operational amplifier; and
   e. said harmonics generator being capable of producing a relatively high level of harmonics at an initial occurrence of said input signal, and incrementally reducing the level of harmonics generated during a time period determined by said time constant following the initial occurrence of said input signal, and producing a relatively low level of harmonics after said time period.

6. The invention as defined in claim 5 wherein said capacitor is 0.1 $\mu F$.

7. The invention as defined in claim 5 wherein said first resistor is 270 k$\Omega$.

8. The invention as defined in claim 5 wherein said second resistor is 2.2 M$\Omega$.

9. The invention as defined in claim 5 wherein said third resistor is 4.7 K$\Omega$.

10. The invention as defined in claim 5 wherein said fourth resistor is 10 K$\Omega$.

11. The invention as defined in claim 5 wherein said negative power source is $-15$ V.

12. A transient discriminate harmonics generator comprising a resistor-capacitor circuit for setting a time constant and a diode rectifying circuit for producing an output signal containing harmonics of an input signal, the harmonics generator being capable of producing a relatively high level of harmonics at an initial occurrence of the input signal, and incrementally reducing the level of harmonics generated during a time period determined by the time constant following the initial occurrence of the input signal, and producing a relatively low level of harmonics after said time period.

13. The invention as defined in claim 12 wherein said diode rectifying circuit includes a diode for rectifying said input signal and an operational amplifier used as a current-voltage converter.

14. The invention as defined in claim 12 further comprising a negative power source for supplying a negative voltage to said cathode of said diode through a resistor circuit.

15. A transient discriminate harmonics generator for generating harmonics of an input signal, comprising:
   a. a multiplier circuit for producing an output signal, the multiplier circuit having an X-channel and a Y-channel, and the output signal being proportional to a product of an X-channel input signal and a Y-channel input signal;
   b. an automatic gain control circuit for producing a control signal to modulate said multiplier circuit, the automatic gain control circuit having an input end and an output end;
   c. said Y-channel of said multiplier circuit and said input end of said automatic gain control circuit being connected together to receive said input signal;
   d. said output end of said automatic gain control circuit being connected to said X-channel of said multiplier circuit, such that said output signal of said multiplier circuit contains harmonics which are proportional to the product of said input signal and said control signal from said automatic gain control circuit; and
   e. said harmonics generator being capable of producing a relatively high level of harmonics at an initial occurrence of said input signal, and incrementally reducing the level of harmonics generated during a time period determined by said control signal following the initial occurrence of said input signal, and producing a relatively low level of harmonics after said time period.

16. The invention as defined in claim 15 wherein said multiplier circuit and said automatic gain control circuit utilize a dual operational transconductance amplifier chip, where said automatic gain control circuit uses one functional half of the dual operational transconductance amplifier chip, and said multiplier circuit uses another functional half of the dual operational transconductance amplifier chip.

17. The invention as defined in claim 15 wherein said input end of said automatic gain control circuit includes a resistor-capacitor circuit for setting a time constant which determines said time period during which said level of harmonics is incrementally reduced.

18. The invention as defined in claim 16 wherein said output end of said automatic gain control circuit utilizes a Darlinton part of said dual operational transconductance amplifier chip.

19. The invention as defined in claim 15 wherein said automatic gain control circuit includes a variable resister circuit for adjusting said control signal which is output from said automatic gain control circuit to said multiplier circuit.

20. The invention as defined in claim 15 further comprising a positive voltage source and a negative voltage source for energizing said automatic gain control circuit and said multiplier circuit.

21. A transient discriminate harmonics generator for generating harmonics of an input signal, comprising:
   a. a multiplier circuit for producing an output signal, the multiplier circuit having an X-channel and a Y-channel, and the output signal being proportional to a product of an X-channel input signal and a Y-channel input signal;
   b. an automatic gain control circuit for producing a control signal to modulate said multiplier circuit, the automatic gain control circuit having an input end and an output end and a variable resister circuit for adjusting the control signal;
   c. said multiplier circuit and said automatic gain control circuit utilizing a dual operational transconductance amplifier chip, where said automatic gain control circuit uses one functional half of the dual operational transconductance amplifier chip, and said multiplier circuit uses another functional half of the dual operational transconductance amplifier chip;

d. said Y-channel of said multiplier circuit and said input end of said automatic gain control circuit being connected together to receive said input signal;

e. said input end of said automatic gain control circuit further including a resistor-capacitor circuit for setting a time constant;

f. said output end of said automatic gain control circuit utilizing a Darlinton part of said dual operational transconductance amplifier chip and connected to said X-channel of said multiplier circuit, such that said output signal of said multiplier circuit contains harmonics which are proportional to the product of said input signal and said control signal from said automatic gain control circuit;

g. a power source for energizing said automatic gain control circuit and said multiplier circuit; and h. said harmonics generator being capable of producing a relatively high level of harmonics at an initial occurrence of said input signal, and incrementally reducing the level of harmonics generated during a time period determined by said time constant following the initial occurrence of said input signal, and producing a relatively low level of harmonics after said time period.

22. The invention as defined in claim 21 wherein said power source includes a positive voltage source and a negative voltage source for energizing said automatic gain control circuit and said multiplier circuit.

23. The invention as defined in claim 21 wherein said variable resistor circuit of said automatic gain control circuit includes a first variable resister of 25 KΩ.

24. The invention as defined in claim 22 wherein said variable resistor circuit of said automatic gain control circuit further includes a second variable resister connected between said positive and negative voltage sources for providing an adjustable working current to said dual operational transconductance amplifier chip.

25. The invention as defined in claim 24 wherein said multiplier further includes a capacitor connected between said input end of said automatic gain control circuit and said Y-channel of said multiplier circuit for isolating any direct current (DC) component of said input signal.

26. A transient discriminate harmonics generator comprising a harmonics generating circuit for producing an output signal containing harmonics of an input signal, and an automatic gain control circuit connected to a gain control input of the harmonics generating circuit and producing a control signal to modulate said harmonics generating circuit, the harmonics generator being capable of producing a relatively high level of harmonics at an initial occurrence of the input signal, and incrementally reducing the level of harmonics generated during a time period determined by the control signal following the initial occurrence of the input signal, and producing a relatively low level of harmonics after said time period.

27. The invention as defined in claim 26 wherein said harmonics generating circuit and said automatic gain control circuit utilize a dual operational transconductance amplifier chip, where said automatic gain control circuit uses one functional half of the dual operational transconductance amplifier chip, and said harmonics generating circuit uses another functional half of the dual operational transconductance amplifier chip.

28. The invention as defined in claim 26 wherein said automatic gain control circuit includes a resistor-capacitor circuit for setting a time constant which determines said time period during which said level of harmonics is incrementally reduced.

29. The invention as defined in claim 26 wherein said automatic gain control circuit includes a variable resister circuit for adjusting said control signal which is output from said automatic gain control circuit to said harmonics generating circuit.

30. The invention as defined in claim 26 further comprising a power source for energizing said automatic gain control circuit and said harmonics generating circuit.

31. A transient discriminate harmonics generator comprising:

a. means for receiving an input signal coupled to a harmonics generating circuit;

b. said harmonics generating circuit being capable of producing an output signal containing harmonics of said input signal;

c. said harmonics generator generating a relatively high level of harmonics at an initial occurrence of said input signal;

d. said harmonics generator incrementally reducing the level of harmonics generated during a time period following the initial occurrence of said input signal; and e. said harmonics generator producing a relatively low level of harmonics after the end of said time period.

32. The invention as defined in claim 31 wherein said harmonic generating circuit is a diode rectifying circuit.

33. The invention as defined in claim 31 wherein said harmonic generating circuit is a linear multiplier circuit.

34. The invention as defined in claim 31 wherein said harmonic generating circuit is a voltage control amplifier circuit.

35. A transient discriminate harmonics generator comprising a control circuit for determining a control parameter, and a harmonics generating circuit regulated by the control circuit for producing an output signal containing harmonics of an input signal, where the transient discriminate harmonics generator first generates a relatively high level of harmonics at an initial occurrence of the input signal, then incrementally reduces the level of harmonics generated during a time period determined by the control parameter following the initial occurrence of the input signal, and finally produces a relatively low level of harmonics after the end of the time period.

36. The invention as defined in claim 35 wherein said harmonic generating circuit is a diode rectifying circuit.

37. The invention as defined in claim 35 wherein said harmonic generating circuit is a linear multiplier circuit.

38. The invention as defined in claim 35 wherein said harmonic generating circuit is a voltage control amplifier circuit.

39. The invention as defined in claim 35 wherein said control circuit is a resistor-capacitor circuit.

40. The invention as defined in claim 35 wherein said control circuit is a automatic gain control circuit.

* * * * *